DIODE BRIDGE SAMPLER AND CAPACITOR STORAGE DEVICE WITH FEED-BACK MEANS PREVENTING DRIFT CAUSED BY DIODE LEAKAGE

Filed Jan. 13, 1958

INVENTOR
MARCEL E. MUSSARD
BY Elmer J. Gorn
ATTORNEY 3,075,086

DIODE BRIDGE SAMPLER AND CAPACITOR STORAGE DEVICE WITH FEED-BACK MEANS PREVENTING DRIFT CAUSED BY DIODE LEAKAGE

Marcel E. Mussard, Waltham, Mass., assignor to Raytheon Company, Lexington, Mass., a corporation of Delaware Filed Jan. 13, 1958, Ser. No. 708,610
8 Claims. (Cl. 307—88.5)

This invention relates to an electronic circuit for sampling an input voltage, storing the sampled value of voltage for a predetermined time, and providing an output signal which does not materially deteriorate during that predetermined time. More particularly the invention pertains to an electronic circuit capable of performing the foregoing functions which circuit does not employ electronic vacuum tubes. The novel electronic circuit forming the subject matter of the invention may be considered as a series switch which closes for a time long enough to charge a storage capacitor and opens thereafter, presenting a very high impedance to the output. The transition from the "closed" condition to the "open" condition can be made very short and the impedance is caused to change from about 50 ohms to several millions of ohms. Difficulties are encountered in realizing such a device with semiconductor diodes because of the slow recovery time of such diodes. That is, it is a characteristic of presently available semiconductor diodes that upon conclusion of a period of forward current conduction, a semiconductor diode does not immediately offer its maximum impedance to the flow of current in the reverse direction. This is to be contrasted with the conventional vacuum tube diode which upon application of a reverse voltage, immediately presents its maximum impedance to the flow of current in the reverse direction. However, the use of vacuum tubes is prohibited in many applications of electronic circuitry because of the fragility of vacuum tubes, the necessity for providing power to heat the filaments of vacuum tubes, the requirement for adequate space and ventilation, and the comparative unreliability of vacuum tubes. In applications where ruggedness and reliability are controlling criterions, the use of solid state devices, such as semiconductor diodes is mandatory. It is, therefore, an object of this invention to provide an electronic pulse sampling and storage circuit which does not utilize vacuum tubes.

The invention comprises a bridge formed by semiconductor diodes in which the diodes are normally held nonconductive by the application of a reverse biasing voltage, means for impressing a voltage to be sampled on the bridge, a pulse transformer or other source of potential for causing the diodes to become forwardly conductive in response to a sampling signal whereby an unbalance in the bridge causes a storage capacitor to be quickly charged to the full value of the voltage to be sampled, the diodes of the bridge becoming non-conductive upon conclusion of the sampling signal, feedback networks connected between the output of the circuit and the diodes in the bridge which function to prevent the leakage currents through the diodes from affecting the voltage stored in the capacitor and unidirectionally conductive devices in the feedback networks for deactivating the networks during the sampling period.

In circuits of the type here considered two time constants are involved: $T_1$ during the sampling period when a storage capacitor charges, and $T_2$ during the storage period between successive samples when the capacitor tends to discharge. In a utilization of this invention which may be considered typical $T_1$ was less than or equal to 0.04 microsecond and $T_2$ was more than or equal to 200 microseconds. The ratio of $T_2/T_1$ was, therefore, equal to or greater than 5,000. This very high ratio of time constants is most difficult to obtain with conventional sampling circuits utilizing semiconductor diodes but satisfactory results were obtained by using the invention. It was also desired that the stored voltage should not deteriorate (droop) by more than ½ of 1% within 1 microsecond and it was established that this objective was attainable.

The features of the invention which are believed to be novel are set forth with particularity in the appended claims. The invention, both as to its organization and method of operation, may best be understood by reference to the following detailed description when considered in connection with the accompanying drawings in which FIG. 1 is a schematic diagram of an elemental form of the invention.

Figure 1:
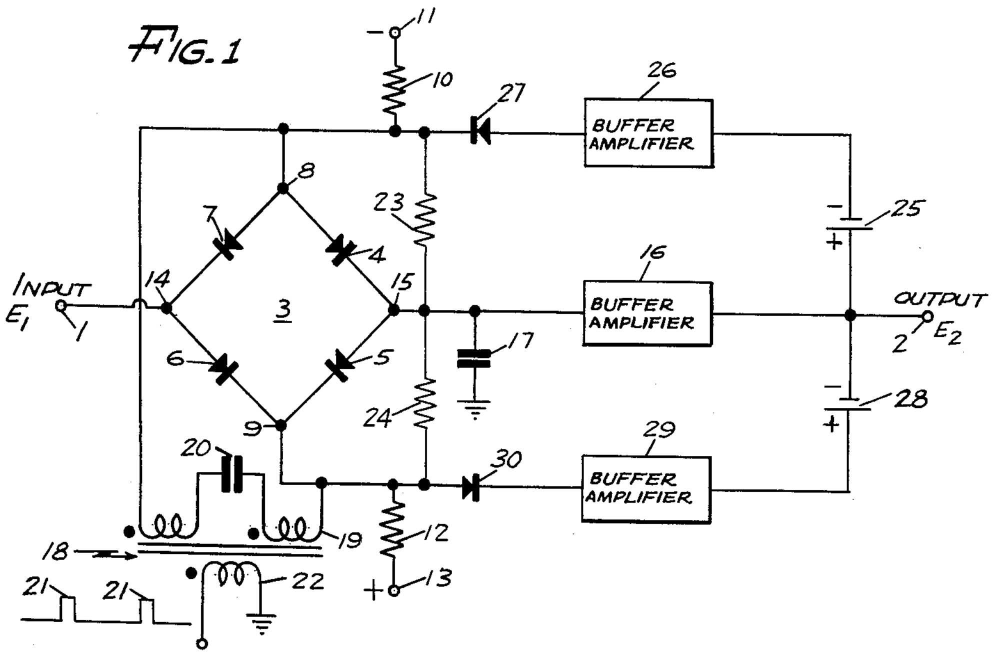

Referring now to FIG. 1, there is shown a schematic diagram of the invention which has been reduced to an elemental form for expository purposes. The input voltage $E_1$ to be sampled is impressed at terminal 1 and the output voltage $E_2$ derived from the sampling and storage circuit is taken from output terminal 2. A bridge 3 consisting of four semiconductor diodes 4, 5, 6, and 7 is arranged to conduct current from junction 8 toward junction 9. The bridge 3 is normally held in its "open" condition (nonconductive) by a negative potential impressed through a limiting resistor 10 at terminal 11 and a positive potential impressed through a limiting resistor 12 at terminal 13. This reverse biasing potential, is of course, materially greater than any input voltage which is to be sampled. While the bridge 3 is open (nonconductive) it effectively isolates junction 14 from junction 15. The input terminal 1 is connected to junction 14. The output terminal 2 is connected through a buffer amplifier 16 to junction 15. A storage capacitor 17 is connected between junction 15 and ground. A pulse transformer is shown at 18 having its secondary winding 19 symmetrically divided into two parts separated by a D.C. isolating capacitor 20 and having timing pulses 21 impressed upon its primary winding 22. The black dots adjacent the ends of the transformer windings, in accordance with convention, indicates that the transformer is wound to cause the ends so marked to be concurrently of the same polarity. That is, the ends of the windings so marked will all be positive at the same time or all negative at the same time. The secondary winding 19 of the transformer is connected so as to impress its induced voltage on bridge 3 between junctions 8 and 9. Now, the timing pulses 21 applied to the primary winding 22 are each of sufficient magnitude to cause the voltage induced in the secondary winding to be in opposition to and exceed the reverse biasing potential applied between terminals 11 and 13. Each timing pulse 21, therefore, causes the bridge 3 to close (become conductive) so that current flows from junction 8 toward junction 9. When the bridge is conductive junctions 14 and 15 are for practical purposes at the same electrical potential and therefore the input voltage $E_1$, impressed at terminal 1, will appear across capacitor 17 and cause that capacitor to rapidly charge to the value of the impressed voltage $E_1$. The charging path can be traced from terminal 1, through bridge 3, and capacitor 17 to ground. Since the forward impedance of each of the diodes in the bridge is small, usually less than 50 ohms, the total impedance of the charging path is small permitting capacitor 17 to charge rapidly. The bridge 3 will remain "closed" for the duration of the timing pulse 21 which should have sufficient length to insure complete charging of capacitor 17. Normally, a period equal to about five time constants $T_1$ is considered sufficient to completely charge a capacitor. Hence, if the charging time constant $T_1$ is 0.04 microsecond a charging period of about .2 microseconds should be permitted. That is, the duration of the timing pulse should be about .2 microsecond.

The sampled voltage $E_2$ is stored in capacitor 17. The diodes 4 and 5 in the bridge are each shunted by a resistor 23, and 24 respectively, each of these resistors having a value of about 500,000 ohms. It has been found that becase the diodes do not recover immediately to their maximum reverse impedance, they have only a resistance of 10,000 to 100,000 ohms during the first 2 microseconds after sampling. Very soon after the sampling, however, the backward impedance of the diodes 4 and 5 in the bridge exceeds the resistance of shunt resistors 23 and 24 so that the actual resistance to which the diodes recover can be neglected. Now, if the diodes 4 and 5 would have equal recovery behavior, their leakage or reverse currents would be approximately equal and therefore would tend to cancel their discharging effect on storage capacitor 17. However, as it is extremely difficult to match accurately the recovery characteristics of semiconductor diodes, I have devised feedback networks to cause the voltages across the diodes 4 and 5 to be maintained constant during the storage period whereby the leakage current drawn through each of these shunted diodes is about equal and the currents cancel each other. Because the leakage currents cancel each other they do not affect the charge on storage capacitor 17. Therefore, the only actual load left on the storage capacitor 17 is the input impedance to buffer amplifier 16, which is made high enough to obtain the desired time constant $T_2$.

Figure 2:
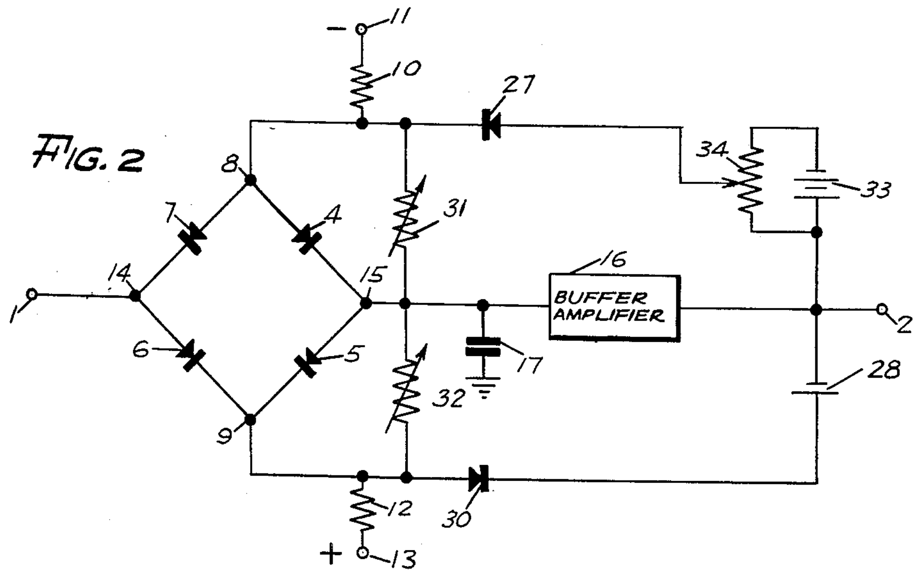
FIG. 2 is a schematic diagram showing methods for compensating for differences in leakage currents between individual diodes used in the circuit.

The feedback network from the output terminal 2 to the diode 4 is constituted by a battery or other source of potential 25, a buffer amplifier 26, and a diode 27. The feedback network to diode 5 is constituted by a battery or other potential source 28, a buffer amplifier 29, and a diode 30. It will be noted that by this arrangement the feedback voltages from output terminal 2 are shifted D.C.-wise by the batteries 25 and 28, the battery 25 causing the feedback voltage to be less positive and the battery 28 causing the feedback voltage to be more positive. The voltage supplied by each of the batteries 25 and 28, for proper operation, should be at least equal to the maximum votlage swing of the input signal applied at terminal 1. For example, where the input signal at 1 varies between +2 volts and −2 volts the maximum voltage swing is 4 volts and therefore the battery 25 should supply 4 volts or more and the battery 28 should supply 4 volts or more. The feedback voltage is applied to diode 4 through diode 27 and the feedback voltage applied to diode 5 is impressed through diode 30. Diodes 27 and 30 are arranged to be forwardly biased during the storage period and cut-off as soon as sampling starts. The actual sampling is therefore independent of the feedback system. As previously stated, where the diodes in the bridge 3 are perfectly matched one to another, their leakage currents are equal and therefore the reverse currents cancel so that no net current flow results. Practically, it is difficult to match diodes as accurately as is necessary for this purpose. Differences in diode characteristics can be compensated in two ways both of which are illustrated in FIG. 2. In FIG. 2, the pulse transformer 18 has been omitted for simplicity but it should be understood that the pulse transformer is connected into the circuit in the same manner as illustrated in FIG. 1. Also, those parts in FIG. 2 which have corresponding parts in FIG. 1 are identified by the same numeral. In order to compensate for differences between the characteristics of diodes 4 and 5, an adjustable resistor 31 is placed in shunt with diode 4 and a second adjustable resistor 32 is placed in shunt with diode 5. By adjusting the value of resistance placed in shunt with those diodes the currents through the diodes 4 and 5 during the storage period can be made equal. It can be appreciated that only one of the resistors 31 and 32 need be adjustable and the other can be a fixed resistance if desired. However, more flexibility of adjustment is secured by making both resistors adjustable.

A second compensation means can be provided by making either one or both of the potential sources 25 and 28 of FIG. 1 adjustable. This is illustrated in FIG. 2 by the battery 33 which is shunted by a potentiometer 34. By varying the tap on the potentiometer the feedback voltage impressed on diode 4 is varied thereby causing a change in the leakage current through that diode. While two compensation means are illustrated in FIG. 2, it should be understood that it is not necessary to incorporate in the circuit both types of compensation means. Although both types may be used together if desired, it is preferable to use only one type to simplify the compensation procedure. Both types of compensation have given good results.

While buffer amplifiers 26 and 29 are included in the feedback networks illustrated in FIG. 1 they have been omitted in FIG. 2 because the sampling and storage circuit will operate without such buffer amplifiers. However, the buffer amplifiers 26 and 29, when present in the circuit, act to avoid any overshoots or "spikes" at the output voltage. Such overshoots tend to occur when the circuit switches from sampling to storage and the overshoots or "spikes" appear in the output voltage $E_2$ unless prevented by the buffer amplifiers. Hence, when the stored voltage must correspond closely to the input voltage which was sampled, a buffer amplifier should be used in the feedback network. For some applications, however, where less accuracy is tolerable, the buffer amplifier may be omitted.

Figure 3:
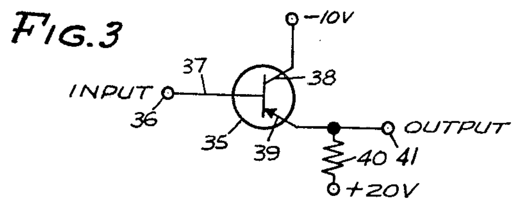
FIG. 3 is a schematic diagram of a buffer amplifier suitable for employment in the invention.

While the particular buffer amplifier employed in the sampling and storage circuit need not be of any particular type except insofar as it should have a high input impedance, for convenience, there is shown in FIG. 3 a suitable buffer amplifier which has been employed with satisfactory results. The transistor circuit of FIG. 3 is the equivalent of a vacuum tube cathode-follower stage. The transistor 35 used in the amplifier is preferably a pnp transistor of the type designated 2N240. The input signal is applied at 36 between ground and the base connection 37 of the transistor. The collector 38 is connected to a biasing source of about −10 volts and the emitter 39 is connected through a load resistor 40 to a +20 volt biasing source. The output from the amplifier is taken from terminal 41 connected to the emitter. The input impedance to this buffer amplifier has been found to be in excess of 10,000 ohms. Where a higher input impedance is required, such as may be necessary for the buffer amplifier 16 of FIG. 1, two or more amplifier stages of the type shown in FIG. 3 may be cascaded until the desired value of input impedance is obtained.

While I have described the preferred embodiment of the invention, the invention need not be limited to the exact apparatus illustrated and it should be understood that modifications which do not depart from the essence of the invention, such as the use of other buffer amplifiers than the type described or the use of a mechanism equivalent in function to the pulse transformer 18, are obvious to those skilled in the art.

What is claimed is:

1. A sampling and storage circuit comprising a switch constituted by four semiconductor diodes arranged to form a bridge, signal input means connected to one junction of said bridge for impressing a voltage to be sampled, a storage capacitor connected to the opposed junction of said bridge, biasing means for causing said diodes to be reversely biased to hold said switch open, means responsive to sampling signals for causing said switch to close, a high input impedance buffer connecting said storage capacitor to an output terminal, and means for compensating for the difference in leakage currents through said diodes in said bridge comprising feedback networks for maintaining the voltages across said diodes constant when said switch is open.

2. A sampling and storage circuit comprising a switch constituted by four semiconductor diodes arranged to form a bridge, signal input means connected to one junction of said bridge for impressing a voltage to be sampled, a storage capacitor connected to the opposed junction of said bridge, biasing means for causing said diodes to be reversely biased to hold said switch open, means responsive to sampling signals for causing said switch to close, a high input impedance buffer connecting said storage capacitor to an output terminal, and feedback networks for controlling the leakage currents through said diodes when said switch is open, each of said feedback networks including a potential source in series with a unidirectionally conductive device.

3. A sampler and storage circuit comprising a switch constituted by four semiconductor diodes connected to form a bridge, said diodes being arranged to cause said bridge to conduct current from a first junction to an opposed second junction when said diodes are forwardly biased, means including a source of potential for reversely biasing said diodes, means responsive to sampling signals for causing forward conduction through said diodes, an input terminal for impressing a voltage to be sampled on a third junction of said bridge, a storage capacitor connected to the fourth junction of said bridge, said storage capacitor being placed in series with said input terminal when said diodes are rendered forwardly conductive, said storage capacitor being connected to an output terminal through a high input impedance buffer, a first feedback network connected between said output terminal and said first junction, a second feedback network connected between said output terminal and said second junction, each of said feedback networks comprising a potential source in series with a diode, said feedback networks regulating the amount of reverse current conduction permitted to flow through the diodes in said bridge.

4. A sampler and storage circuit comprising a switch constituted by four semiconductor diodes connected to form a bridge, said diodes being arranged to cause said bridge to conduct current from a first junction to an opposed second junction when said diodes are forwardly biased, means including a source of potential for reversely biasing said diodes, means responsive to sampling signals for causing forward conduction through said diodes, an input terminal for impressing a voltage to be sampled on a third junction of said bridge, a storage capacitor connected to the fourth junction of said bridge, said storage capacitor being placed in series with said input terminal when said diodes are rendered forwardly conductive, said storage capacitor being connected to an output terminal through a high input impedance buffer, a first feedback network connected between said output terminal and said first junction, a second feedback network connected between said output terminal and said second junction, each of said feedback networks comprising a potential source in series with a diode, and adjustable means associated with at least one of said feedback networks for varying the current flowing through said one network.

5. A sampler and storage circuit comprising a switch constituted by four semiconductor diodes connected to form a bridge, said diodes being arranged to cause said bridge to conduct current from a first junction to an opposed second junction when said diodes are forwardly biased, means including a source of potential for reversely biasing said diodes, means responsive to sampling signals for causing forward conduction through said diodes, an input terminal for impressing a voltage to be sampled on a third junction of said bridge, a storage capacitor connected to the fourth junction of said bridge, said storage capacitor being placed in series with said input terminal when said diodes are rendered forwardly conductive, said storage capacitor being connected to an output terminal through a high input impedance buffer, a first feedback network connected between said output terminal and said first junction, a second feedback network connected between said output terminal and said second junction, each of said feedback networks comprising a potential source in series with a diode, said diode in said feedback network being arranged therein to be non-conductive when the diodes in said bridge are rendered forwardly conductive, and adjustable means associated with at least one of said networks for regulating the flow of current.

6. A sampler and storage circuit comprising a switch constituted by four semiconductor diodes connected to form a bridge, said diodes being arranged to cause said bridge to conduct current from a first junction to an opposed second junction when said diodes are forwardly biased, means including a source of potential for reversely biasing said diodes, means responsive to sampling signals for causing forward conduction through said diodes, an input terminal for impressing a voltage to be sampled on a third junction of said bridge, a storage capacitor connected to the fourth junction of said bridge, said storage capacitor being placed in series with said input terminal when said diodes are rendered forwardly conductive, said storage capacitor being connected to an output terminal through a high input impedance buffer, a first feedback network connected between said output terminal and said first junction, a second feedback network connected between said output terminal and said second junction, each of said feedback networks comprising a potential source in series with a diode, said diode in said feedback network being arranged therein to be non-conductive when the diodes in said bridge are rendered forwardly conductive, and a variable resistor having one end electrically connected to said fourth junction and shunting one of the diodes in said bridge.

7. A sampler and storage circuit comprising a switch constituted by four semiconductor diodes connected to form a bridge, said diodes being arranged to cause said bridge to conduct current from a first junction to an opposed second junction when said diodes are forwardly biased, means including a source of potential for reversely biasing said diodes, means responsive to sampling signals for causing forward conduction through said diodes, an input terminal for impressing a voltage to be sampled on a third junction of said bridge, a storage capacitor connected to the fourth junction of said bridge, said storage capacitor being placed in series with said input terminal when said diodes are rendered forwardly conductive, said storage capacitor being connected to an output terminal through a high input impedance buffer, a first feedback network connected between said output terminal and said first junction, a second feedback network connected between said output terminal and said second junction, each of said feedback networks comprising a potential source in series with a diode, said diode in said feedback network being arranged therein to be non-conductive when the diodes in said bridge are rendered conductive, and the potential source in at least one of said feedback networks having means associated therewith for varying its potential.

8. A sampler and storage circuit comprising a switch constituted by four semiconductor diodes connected to form a bridge, said diodes being arranged to cause said bridge to conduct current from a first junction to an opposed second junction when said diodes are forwardly biased, means including a source of potential for reversely biasing said diodes, means responsive to sampling signals for causing forward conduction through said diodes, an input terminal for impressing a voltage to be sampled on a third junction of said bridge, a storage capacitor connected to the fourth junction of said bridge, said storage capacitor being placed in series with said input terminal when said diodes are rendered forwardly conductive, said storage capacitor being connected to an output terminal through a high input impedance buffer, a first feedback network connected between said output terminal and said first junction, a second feedback network connected between said output terminal and said second junction, each of said feedback networks comprising a potential source in series with a diode and a buffer amplifier, said diodes in said feedback networks being arranged to deactivate said networks when the said diodes in said bridge are rendered forwardly conducitve, and variable means associated with at least one of said feedback networks for regulating the flow of reverse current through the diode of said bridge connected in said feedback network.

References Cited in the file of this patent

UNITED STATES PATENTS

| | | |
|---|---|---|
| 2,551,619 | McWhirter | May 8, 1951 |
| 2,831,126 | Linvill et al. | Apr. 15, 1958 |
| 2,866,103 | Blake et al. | Dec. 23, 1958 |
| 2,874,311 | Turnage | Feb. 17, 1959 |
| 2,965,771 | Finkel | Dec. 20, 1960 |

OTHER REFERENCES

Waveforms, by Chance et al., volume 19, 1st ed. published 1949, see pages 409–413.

UNITED STATES PATENT OFFICE

CERTIFICATE OF CORRECTION

Patent No. 3,075,086 January 22, 1963

Marcel E. Mussard

It is hereby certified that error appears in the above numbered patent requiring correction and that the said Letters Patent should read as corrected below.

Column 3, line 49, for "votlage" read -- voltage --; column 4, line 53, for "10,000" read -- 100,000 --.

Signed and sealed this 8th day of October 1963.

(SEAL)
Attest:

ERNEST W. SWIDER
Attesting Officer

EDWIN L. REYNOLDS
Acting Commissioner of Patents